United States Patent
Yu et al.

(10) Patent No.: US 11,056,428 B2
(45) Date of Patent: Jul. 6, 2021

(54) SEMICONDUCTOR DEVICE EXTENSION INSULATION

(71) Applicant: Taiwan Semiconductor Manufacturing Co., Ltd., Hsin-Chu (TW)

(72) Inventors: Hung-Chih Yu, Hsinchu (TW); Chien-Mao Chen, Zhubei (TW)

(73) Assignee: Taiwan Semiconductor Manufacturing Co., Ltd., Hsin-Chu (TW)

( * ) Notice: Subject to any disclaimer, the term of this patent is extended or adjusted under 35 U.S.C. 154(b) by 0 days.

(21) Appl. No.: 16/738,936

(22) Filed: Jan. 9, 2020

(65) Prior Publication Data

US 2020/0144181 A1 May 7, 2020

Related U.S. Application Data

(62) Division of application No. 15/664,990, filed on Jul. 31, 2017, now Pat. No. 10,535,598.

(51) Int. Cl.
| | |
|---|---|
| H01L 23/522 | (2006.01) |
| H01L 21/768 | (2006.01) |
| H01L 23/48 | (2006.01) |
| H01L 23/528 | (2006.01) |
| H01L 29/78 | (2006.01) |
| H01L 23/532 | (2006.01) |

(52) U.S. Cl.
CPC .... *H01L 23/5226* (2013.01); *H01L 21/76843* (2013.01); *H01L 21/76879* (2013.01); *H01L 21/76883* (2013.01); *H01L 21/76888* (2013.01); *H01L 23/481* (2013.01); *H01L 23/528* (2013.01); *H01L 23/53228* (2013.01); *H01L 23/53257* (2013.01); *H01L 23/53266* (2013.01); *H01L 29/78* (2013.01)

(58) Field of Classification Search
CPC . H01L 23/5226; H01L 23/528; H01L 23/522; H01L 23/481; H01L 21/76843; H01L 21/76879; H01L 21/76883; H01L 21/76814; H01L 21/76802; H01L 21/76805; H01L 21/76807; H01L 21/76888
See application file for complete search history.

(56) References Cited

U.S. PATENT DOCUMENTS

| | | | |
|---|---|---|---|
| 2004/0140523 A1 | 7/2004 | Hudgens | |
| 2009/0045515 A1* | 2/2009 | Gonzalez, Jr. | ........ H01L 21/288 257/751 |
| 2014/0332964 A1* | 11/2014 | Yang | ..................... H01L 21/768 257/762 |
| 2015/0325523 A1 | 11/2015 | Leobandung | |

* cited by examiner

*Primary Examiner* — Marcos D. Pizarro
*Assistant Examiner* — Antonio B Crite
(74) *Attorney, Agent, or Firm* — Duane Morris LLP

(57) ABSTRACT

A semiconductor device includes: a plurality of vertical conductive structures, wherein each of the plurality of vertical conductive structures extends through an isolation layer; and an insulated extension disposed horizontally between a first one and a second one of the plurality of vertical conductive structures.

15 Claims, 6 Drawing Sheets

SEMICONDUCTOR DEVICE EXTENSION INSULATION

CROSS-REFERENCE TO RELATED APPLICATION

This application is a divisional of U.S. patent application Ser. No. 15/664,990, filed Jul. 31, 2017, which is incorporated by reference herein in its entirety.

BACKGROUND

The semiconductor industry has constantly pursued higher device densities with lower costs. Technological advances in semiconductor device, or integrated circuit (IC), materials, designs and manufacturing processes have produced progressively smaller circuits. In the course of this IC evolution, functional density (for example, the number of interconnected devices per chip area) has generally increased while geometry sizes have decreased. This scaling down process generally provides benefits by increasing production efficiency and lowering associated costs The general manufacturing scheme of an IC includes two parts, front end of line (FEOL) processing and back end of line (BEOL) processing. Generally, BEOL contains passive, linear devices made from metals and insulators, such as signal and power wires, transmission lines, metal resistors, metal-insulator-metal (MIM) capacitors, inductors, and fuses. BEOL may include devices being wired together with a patterned multilevel metallization process.

This scaling down process has increased the complexity of processing and manufacturing ICs. As device density increases and device scale decreases, short circuits or cross talk may occur during BEOL processing in ICs, resulting in the decrease of yield.

Therefore, conventional semiconductor device fabrication and processing techniques have not been entirely satisfactory.

BRIEF DESCRIPTION OF THE DRAWINGS

Aspects of the present disclosure are best understood from the following detailed description when read with the accompanying figures. It is noted that various features are not necessarily drawn to scale. In fact, the dimensions and geometries of the various features may be arbitrarily increased or reduced for clarity of discussion.

DETAILED DESCRIPTION OF EXEMPLARY EMBODIMENTS

Figure 1A:
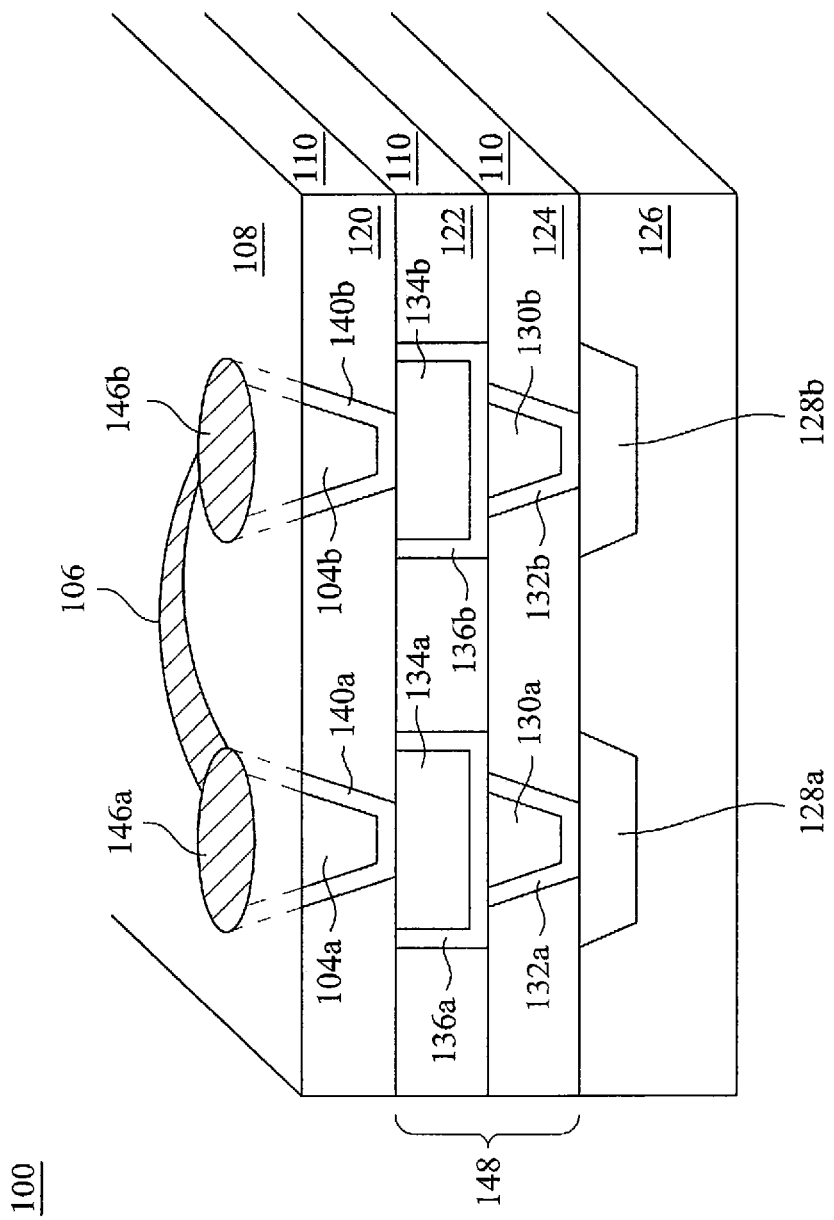
FIG. 1A is a three dimensional view of a semiconductor device with a conductive extension in accordance with certain embodiments.

The following disclosure describes various exemplary embodiments for implementing different features of the subject matter. Specific examples of components and arrangements are described below to simplify the present disclosure. These are, of course, merely examples and are not intended to be limiting. For example, it will be understood that when an element is referred to as being "connected to" or "coupled to" another element, it may be directly connected to or coupled to the other element, or one, or more intervening elements may be present.

In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

Generally described and introduced above, back-end-of-line (BEOL) processing may include conductive features being wired together in a patterned multilevel conducting process to produce a semiconductor device, such as an IC. The conductive features may be, be part of, or may contain active and nonlinear devices including a semiconductor, such as transistors, diodes, varactors, photodetectors, photo-emitters, polysilicon resistors, MOS (metal-oxide-silicon or metal-oxide-semiconductor) capacitors, waveguides, waveguide modulators, conductive layers, metallization layer, and the like. The conductive features are formed in a level-by-level scheme and on a semiconductor substrate which is formed in the front end of line (FEOL) processing. The conductive features couple with a plurality of conductive structures (e.g., conductive lines and vias) that interconnect the conductive features. Stated another way, conductive structures interconnect conductive features.

As the dimensions of a semiconductor device scale down, the density of the conductive structures and conductive features may increase so as to enhance the probability of short circuits or cross talk, resulting in the decrease of yield. Conductive extensions may be miniscule conductive artifacts deposited, displaced, uncovered, or formed on a semiconductor device during semiconductor processing. Examples of conductive extensions include excess conductive slurry or displaced conductive material from a conductive structure deposited on a surface of a semiconductor device during a chemical-mechanical planarization (CMP) process, lithography, or etching. As another example, conductive extensions can be formed when processing a semiconductor device in an insufficiently purified environment where conductive impurities in the air may deposit on the semiconductor device during semiconductor processing. In some embodiments, conductive extensions may also be formed from removal (in whole or part) of an insulating, or non-conductive, material that would, if not removed, insulate conductive structures from each other, as will be discussed further below.

These conductive extensions may or may not contact (e.g., extend to) conductive structures on a semiconductor device. For example, bridge conductive extensions may form a bridge that physically contacts at least two conductive structures that would otherwise be conductively insulated from each other by a non-conductive separation (of non-conductive material) that is sufficient to avoid an undesirable short circuit or undesirable cross talk. The non-conductive separation may include material that may incur the effects of an electric field, but not be composed of conductive material, as will be discussed further below. However, conductive extensions may extend from one conductive structure and increase the conductive reach (e.g., conductive coupling from an electric field and/or potential for cross talk) of that extended conductive structure to undesirably affect a second conductive structure in the vicinity of the extended part of that extended conductive structure without physically coupling to that second conductive structure. Also, conductive extensions may physically contact no conductive structure but be close enough to nearby conductive structures to undesirably extend the conductive reach of the nearby conductive structures by acting as an undesirable channel for conductivity, or conductive extension, for the nearby conductive structures.

Furthermore, conductive extensions that extend the conductive reach of conductive structures may not only extend the conductive reach of conductive structures, but may also extend the conductive reach of conductive features within the semiconductor device. As introduced above, conductive structures may interconnect or be in conductive communication with conductive features. Accordingly, when conductive extensions undesirably extend the conductive reach of conductive structures, they may also undesirably extend the conductive reach of conductive features within the semiconductor device.

Therefore, as semiconductor devices scale down, minimizing the undesirable conductive reach (e.g., short circuits or cross talk) of conductive structures caused by these conductive extensions becomes increasingly advantageous.

The present application relates to systems and methods for insulating extensions. As introduced above, extensions may be initially conductive, due to being formed of a conductive material. As a non-limiting example, a conductive material may be a material of less than high resistance, or less than a resistance value of about $1.6*10^{-6}$ Ω-cm. Also, as a non-limiting example, a non-conductive material, or an insulating material may be a material with a resistance value that is about $1.6*10^{-6}$ Ω-cm or more.

An extension may be initially conductive due to being formed from a conductive material, such as material from a conductive structure or residual conductive material that is left on the semiconductor device after or during semiconductor processing. These conductive extensions may be undesirable as they may result in undesirable short circuits or cross talk between conductive structures that were designed to be conductively isolated from each other.

These conductive extensions may be insulated to reduce the undesirable conductive reach of the conductive structure produced by an extension that is conductive (conductive extension). Extensions may be insulated by subjecting the extension (and/or a surface of the semiconductor device) to an insulation process that reduces the conductivity of materials exposed to the insulation process. In certain embodiments, the extension may be insulated by oxidizing the extension (and/or a surface of the semiconductor device) though exposure to an oxidizing gas or plasma to form an extension that is insulated (insulated extension). For example, the insulation process may include exposing (e.g., bombarding) a surface of the semiconductor device (such as a surface that includes at least one conductive extension) to an insulating medium such as $O_2$ plasma with $Ar^+$ or $N^+$. The surface of the semiconductor device exposed to the insulating medium may become insulated, with lowered conductivity and increased resistivity. Stated another way, exposure of conductive extensions to the insulating medium during the insulation process may transform the conductive extension to an insulated extension composed of high (or higher) resistance material (or non-conductive material) with a resistance value of about $1.6*10^{-6}$ Ω-cm to about $1.6*10^{4}$ Ω-cm or greater (to contrast with to lower resistance, conductive material). The high (or higher) resistance material may include copper oxide, copper nitride, aluminum oxide, aluminum nitride or other suitable materials. Particularly, the copper oxide may include $Cu_xO_y$, x is 1 or 2, and y is 1 or 2.

Also, the insulating medium may transform a portion of the semiconductor device from the surface exposed to the insulating medium to a particular effective depth (e.g., depth of insulation or insulation depth) into the semiconductor device. In certain embodiments, this effective depth may be about 30 angstroms (Å) to about 150 Å. This effective depth may be much smaller than a depth of a conductive feature, such that the conductive feature can transmit electrical current even if exposed to the insulating medium. For example, the effective depth may be an order of magnitude smaller than a depth of the conductive feature from the semiconductor surface exposed to the insulating medium. Accordingly, conductive extensions that are embedded within the semiconductor material (such as via non-conductive artifacts deposited on the surface of the conductive extension during semiconductor processing) may also be transformed into insulated extensions if within the effective depth of the insulating medium during the insulation process (e.g., within an insulated layer produced by exposure to the insulating medium). Also, the insulation process may be tailored to effect a particular effective depth so as to insulate undesirable conductive extensions while not insulating desirable conductive features within the semiconductor device. The insulation process may be tailored by varying features of the insulation process, such as the surface exposed to the insulating medium, the time at which the insulating medium is applied to the semiconductor device, and the potency (e.g., concentration) of the insulating medium. [Inventors: do you have technical specifications on how much time the insulating medium is applied (time, concentration, areas of application, etc.) to achieve certain results (e.g., how much to apply to achieve particular effective depths and what an effective depth is)?]

This insulation process may be performed after (or in response to) detection or formation of conductive extensions. Alternatively, this insulation process may be performed as an precautionary step during semiconductor processing without detecting or forming conductive extensions.

FIG. 1A is a three dimensional view of a semiconductor device 100 with a conductive extension 106 in accordance with certain embodiments. The semiconductor device 100 includes vertical conductive structures 104a, 104b, (e.g., vias) that extend into the semiconductor device 100 from the surface 108 of the semiconductor device 100. The vertical conductive structures 104a, 104b may include an exposed portion 146a, 146b along the surface 108 of the semiconductor device 100. The vertical conductive structures 104a, 104b extend through an isolation layer 120 that insulates each vertical conductive structure 146a, 146b from the other. Also, as will be discussed in greater detail below, the semiconductor device 100 may include the conductive extension 106 on the isolation layer and across the surface 108 of the semiconductor device.

The semiconductor device 100 may include a substrate 126 with conductive features 128a, 128b. The vertical conductive structures 104a, 104b that are part of the isolation layer 120, and the substrate 126 with conductive features 128a, 128b, may be separated by various intermediate layers 148. These intermediate layers 148 may include intermediate conductive structures (e.g., conductive structures 134a, 130a, 134b, 130b) that provides a conductive path between the vertical conductive structures 104a, 104b with respective conductive features 128a, 128b. For example, the intermediate layers 148 may include an intermediate metallization layer 122 that includes intermediate horizontal conductive structures 134a, 134b (e.g., conductive lines). Also, the intermediate layers 148 may include an intermediate isolation layer 124 that includes intermediate vertical conductive structures 130a, 130b (e.g., vias). Accordingly, vertical conductive structure 104a may be in conductive communication with conductive feature 128a by conductive coupling with intermediate horizontal conductive structure 134a and vertical conductive structure 130a. Also, vertical conductive structure 104b may be in conductive communication with conductive feature 128b by conductive coupling with intermediate horizontal conductive structure 134b and vertical conductive structure 130b.

The conductive features of each layer 120, 122, 124 may be (at least partially) surrounded within each layer by a non-conductive material 110, which will be discussed in further detail below. This non-conductive material 110 provides a non-conductive separation between conductive features that conductively isolates conductive features from each other by preventing conductive shorts or undesirable cross talk between conductive structures. With respect to other layers, each layer may have the same, or may have a different non-conductive material 110 than another layer. Also, one layer may include the same, or different non-conductive material 110.

Figure 1B:
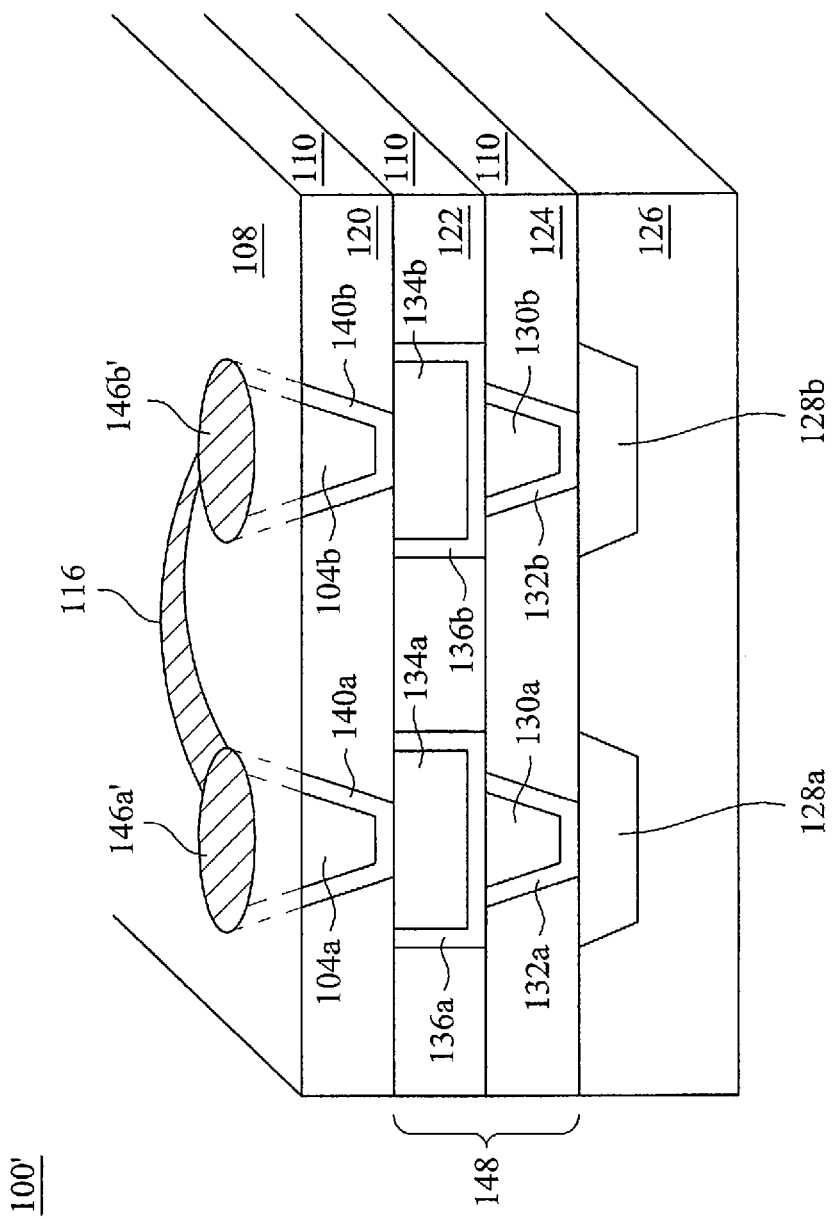
FIG. 1B is a three dimensional view of a semiconductor device with an insulated extension in accordance with certain embodiments.

In certain embodiments, as illustrated in FIGS. 1A and 1B, each of the conductive structures 104a, 104b, 134a, 134b, 130a, 130b, may be at least partially separated from other conductive structures, conductive features, or a non-conductive material 110 within each layer 120, 122, 124 by a barrier layer 140a, 140b, 136a, 136b, 132a, 132b. This barrier layer may effectively prevent metal atoms from diffusing from conductive materials into non-conductive materials 110 during a deposition process to form conductive structures or conductive features. For example, within the isolation layer 120, the vertical conductive structure 104a, 104b may be separated from conductive material within the isolation layer 120 by respective barrier layers 140a, 140b. Within the intermediate metallization layer 122, the intermediate horizontal conductive structures 134a, 134b may be separated from conductive material within the metallization layer by respective barrier layers 136a, 136b. Within the intermediate isolation layer 124, the intermediate vertical conductive structures may be separated from conductive material within the intermediate isolation layer 124 by respective barrier layers 132a, 132b. The barrier layers will be discussed in further detail below.

Although FIG. 1A depicts two intermediate layers 122, 124, the semiconductor device 100 may include any number of intermediate layers as desired for various applications in accordance with different embodiments. For example, in certain embodiments, the vertical conductive structures 104a, 104b may directly couple with respective conductive features 128a, 128b and be separated by no intermediate layers. Alternatively, the semiconductor device 100 may include one intermediate layer or more than two intermediate layers, with respective conductive structures that form a conductive path between the vertical conductive structures 104a, 104b and respective conductive features 128a, 128b.

In some embodiments, the substrate may include elementary semiconductor material such as, for example, germanium or silicon. The substrate may also include a compound semiconductor such as silicon carbide, gallium arsenic, indium arsenide, and indium phosphide. The substrate may include an alloy semiconductor such as silicon germanium, silicon germanium carbide, gallium arsenic phosphide, and gallium indium phosphide. In one embodiment, the substrate includes an epitaxial layer. For example, the substrate may have an epitaxial layer overlying a bulk semiconductor. Furthermore, the substrate may include a semiconductor-on-insulator (SOI) structure. For example, the substrate may include a buried oxide (BOX) layer formed by a process such as separation by implanted oxygen (SIMOX) or other suitable technique, such as wafer bonding and grinding.

In some embodiments, the substrate includes various p-type doped regions and/or n-type doped regions, implemented by a process such as ion implantation and/or diffusion. Those doped regions include n-well, p-well, light doped region (LDD), heavily doped source and drain (S/D), and various channel doping profiles configured to form various integrated circuit (IC) devices, such as a complimentary metal-oxide-semiconductor field-effect-transistor (CMOS FET), imaging sensor, and/or light emitting diode (LED). The substrate may further include other functional features such as a resistor or a capacitor formed in and on the substrate. The substrate further include lateral isolation features provided to separate various devices formed in the substrate. In one embodiment, shallow trench isolation (STI) features are used for lateral isolation. The various devices further include silicide disposed on S/D, gate and other device features for reduced contact resistance when coupled to output and input signals.

As introduced above, in certain embodiments, the layers 120, 122, 124 may include a non-conductive material 110. The non-conductive material 110 may include a material that is at least one of: silicon oxide, a low dielectric constant (low-k) material, other suitable dielectric material, or a combination thereof. The low-k material may include fluorinated silica glass (FSG), phosphosilicate glass (PSG), borophosphosilicate glass (BPSG), carbon doped silicon oxide ($SiO_xC_y$), Black Diamond® (Applied Materials of Santa Clara, Calif.), Xerogel, Aerogel, amorphous fluorinated carbon, Parylene, BCB (bis-benzocyclobutenes), SiLK (Dow Chemical, Midland, Mich.), polyimide, and/or other future developed low-k dielectric materials.

In some embodiments, the conductive structures 104a, 104b, 134a, 134b, 130a, 130b include a conductive material (e.g., a metal material) such as, for example, copper (Cu), tungsten (W), or a combination thereof. In some other embodiments, the conductive material may include other suitable metal materials (e.g., gold (Au), cobalt (Co), silver (Ag), etc.) and/or conductive materials (e.g., polysilicon) while remaining within the scope of the present disclosure.

In some embodiments, the barrier layer 140a, 140b, 136a, 136b, 132a, 132b may reside between conductive structures to conductive structures, conductive structures to conductive features, conductive features to conductive features, conductive structures to non-conductive materials, and conductive features to non-conductive materials. Barrier layers may effectively prevent metal atoms from diffusing from conductive materials into non-conductive materials during a deposition process to form conductive structures or conductive features. Barrier layers may also enhance conductivity between adjoining conductive materials. Each barrier layer may include one or more layers, wherein each layer may be formed of a barrier material such as tantalum nitride (TaN), tantalum (Ta), titanium nitride (TiN), titanium (Ti), cobalt tungsten (CoW), tungsten nitride (WN), or the like.

The vertical conductive structures 104*a*, 104*b*, 130*a*, 130*b* may be part of an isolation layer 120 or intermediate isolation layer 124. The vertical conductive structures 104*a*, 104*b*, 130*a*, 130*b* and the isolation layers 120, 124 may be formed by at least some of the following process steps: using chemical vapor deposition (CVD), physical vapor deposition (PVD), spin-on coating, and/or other suitable techniques to deposit the non-conductive material over a lower layer or substrate to form an initial first isolation layer (the isolation layer is a remaining portion of the initial first isolation layer after the later performed patterning process); performing one or more patterning processes (e.g., a lithography process, a dry/wet etching process, a cleaning process, a soft/hard baking process, etc.) to form openings through the initial first isolation layer (overlaying lower conductive features or conductive structures); using CVD, PVD, and/or other suitable techniques to deposit the aforementioned barrier material along a bottom surface and sidewalls of the openings to surround the openings; using CVD, PVD, E-gun, and/or other suitable techniques to fill the openings with the conductive material, and polishing out excessive conductive material to form the vertical conductive structures 104*a*, 104*b*, 130*a*, 130*b*.

The horizontal conductive structures 134*a*, 134*b*, and part of the metallization layer 122, may be formed by at least some of the following process steps: using CVD, PVD, spin-on coating, and/or other suitable techniques to deposit the non-conductive material over the intermediate isolation layer 124 (or otherwise over a lower layer or substrate) to form a dielectric layer (the dielectric layer is a remaining portion after the later performed patterning process); performing one or more patterning processes (e.g., a lithography process, a dry/wet etching process, a cleaning process, a soft/hard baking process, etc.) to form openings through the initial first dielectric layer; using CVD, PVD, and/or other suitable techniques to deposit the aforementioned barrier material to surround the openings; using CVD, PVD, E-gun, and/or other suitable techniques to fill the openings with the conductive material, and polishing out excessive conductive material to form the horizontal conductive structures 134*a*, 134*b*.

A scratch may be a physically induced aberration across the top surface 108 (or other surface) of the semiconductor device 100 that displaces conductive material from vertical conductive structure 104*a*, 104*b* (or, more specifically, from exposed top portions 146*a*, 146*b* of vertical conductive structures 104*a*, 104*b*) into a buffer location between structures 104A, 104B, 104C that separates vertical conductive structures 104A, 104B, 104C from each other. [Inventors: is this description of the scratch correct?] The buffer location may be a surface 108 of the semiconductor device 100 along the non-conductive material 110 that separates the vertical conductive structures 104*a*, 104*b* via a non-conductive separation. For example, the scratch may be produced during a polishing process (e.g., a chemical mechanical planarization (CMP) process) due to movement of conductive material from at least one of the vertical conductive structures 104*a*, 104*b*. The scratch may be formed across a surface 108 of the non-conductive material 110 (along the semiconductor device (e.g., IC wafer)) and include displaced conductive material from at least one of the vertical conductive structures 104*a*, 104*b*.

The scratch may create a conductive extension 106 that extends the conductive reach of a conductive structure (or a conductive feature in conductive communication with the conductive structure). As introduced above, a scratch may displace conductive material from the vertical conductive structure 104*b* across the non-conductive material 110 to contact the vertical conductive structure 104*a*. The displaced conductive material forms a bridge conductive extension 106 composed of conductive material extending from the vertical conductive structure 104*b* to the vertical conductive structure 104*a*. This bridge conductive extension 106 may be an undesirable short circuit between the vertical conductive structure 104*a* and the vertical conductive structure 104*b*.

In certain embodiments, the bridge conductive extension 106 may not be coplanar with top surface 108 and may protrude above (or in other embodiments be lower) than the top surface of the semiconductor device 100. Also, the materials of the bridge conductive extension 106 and the vertical conductive structures 104*a*, 104*b* may be the same, or may be different.

As introduced above, conductive extensions formed by the scratch may be a bridge conductive extension that contacts and short circuits different conductive structures that otherwise would enjoy insulation from each other without a short circuit due to an effective non-conductive separation. Also, the scratch may create conductive extensions by extending the conductive reach of conductive structures that are nearer to the scratch but do not contact (or is spaced from) the material deposited by the scratch, due to the extension of the effective electrical field of conductive structures that couple with the conductive material deposited by the scratch.

The undesirable short circuit between the vertical conductive structure 104*a* and the vertical conductive structure 104*b* may be avoided by applying the insulation process (introduced above), that substantially reduces the conductivity of materials, to the conductive extension 106. This may include oxidizing or nitriding the surface 108 of the semiconductor device (along with the portions of the conductive extension 106 and the exposed portion 146*a*, 146*b* of the vertical conductive structures 104*a*, 104*b* along the surface 108) by exposing the surface 108 to an insulating medium.

FIG. 1B is a three dimensional view of a semiconductor device 100' after application of an insulation process in accordance with certain embodiments. As introduced above, the insulation process may include applying an insulating medium, such as an oxidizing or nitriding gas or plasma, to the surface 108 of the semiconductor device 100 (shown in FIG. 1A) along which the conductive extension 106 is exposed. The conductive extension (shown in FIG. 1A) is then oxidized and transformed into an insulated extension 116 as illustrated in FIG. 1B. Also, conductive material from the vertical conductive structures 104*a* 104*b*, exposed to the insulating medium (e.g., oxidizing or nitriding gas or plasma), specifically at the exposed portion 146*a'*, 146*b'*, may also be oxidized or nitrated and transformed into an insulated, non-conductive material.

In certain embodiments, the insulated extension 116 may not be coplanar with the surface 108 of the semiconductor device. For example, the insulated extension 116 may be formed from a deposit of conductive material on the surface 108 such that the insulated extension 116 protrudes from (or is a depression into) the surface 108. Also, the surface 108 may be composed of a non-conductive material (e.g., the material 110). Accordingly, the insulation process that produces the insulated extension 116 may be applied to a protruding (or depressed) conductive extension and may be applied also to a non-conductive material, or a non-conductive surface of the semiconductor device. Advantageously, application of the insulating medium (as part of the insulation process) to a protruding (or depressed) conductive extension may more effectively transform the protruding (or depressed) conductive extension to an insulated extension as more surface area of the protruding (or depressed) conductive extension may be exposed to the insulating medium than if the conductive extension is coplanar with a surface of the semiconductor device (and/or partially and/or wholly embedded in the semiconductor device).

Furthermore, the insulation process may include applying the insulating medium to multiple (or several non-coplanar) surfaces of the semiconductor device and/or to all surfaces of the semiconductor device to transform conductive parts of the surface of the semiconductor device to become insulated. Advantageously, exposing multiple surfaces of the semiconductor device (as opposed to a particular conductive surface or a particular conductive extension of the semiconductor device) may transform conductive extensions to insulated extensions across multiple surfaces of the semiconductor device in parallel, rather than performing such transformations serially by one surface (or by one conductive extension) at a time.

Figure 2A:
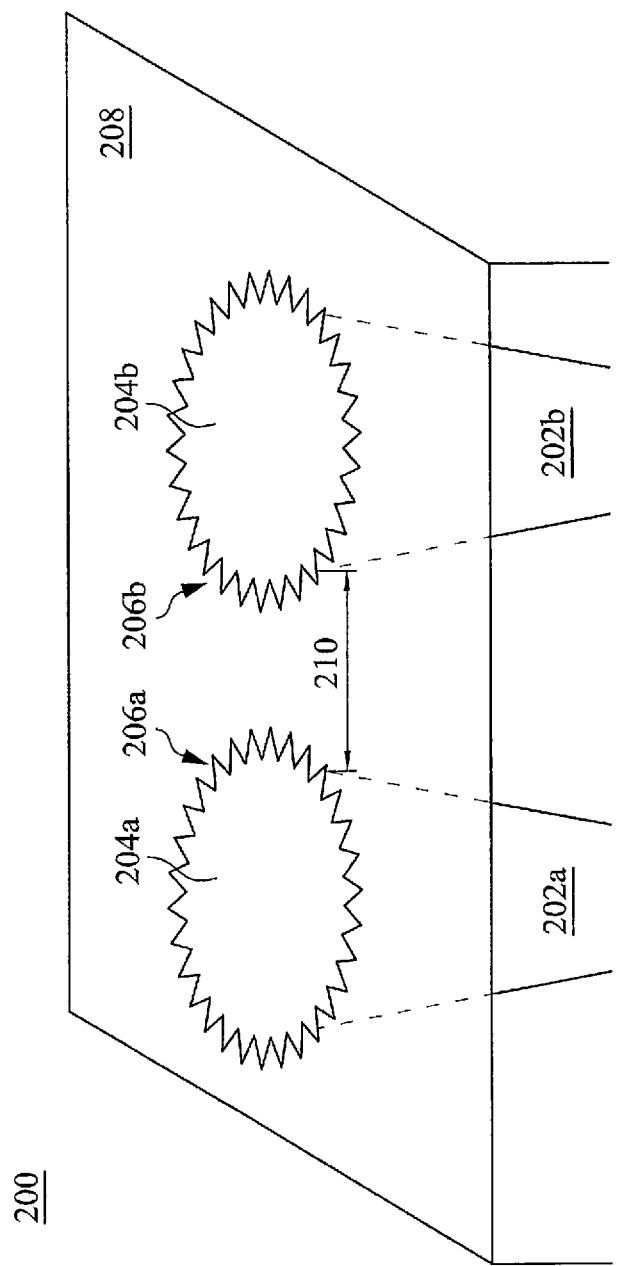
FIG. 2A illustrates conductive structures with striated conductive extensions in accordance with certain embodiments.

FIG. 2A illustrates conductive structures 202a, 202b with striated conductive extensions 206a, 206b, or conductive extensions caused by striation, in accordance with certain embodiments. The conductive structures 202a 202b may be part of a semiconductor device 200. The conductive structures 202a, 202b have exposed portions 204a, 204b along a top surface 208 of the semiconductor device 200. The exposed portions 204a, 204b may have striations, which may be striated conductive extensions 206a, 206b, that may extend outward from the exposed portions 204a, 204b of the conductive structures 202a, 202b. The striations may be caused inadvertently or by design during semiconductor processing.

In certain embodiments, striation of the conductive structures may be conductive extensions 206a, 206b from the conductive structures 202a, 202b that effect a reduced non-conductive separation 210 (e.g., buffer location) between the conductive structure 202a and the conductive structure 202b. These conductive extensions 206a, 206b may not form a physical connection or bridge between the two conductive structures 202a, 202b but may produce a reduced non-conductive separation 210 between the conductive structures 202a, 202b (when compared to non-conductive separations without conductive extensions, such as discussed below in connection with FIG. 2B) and extend the conductive reach of the conductive structures 202a, 202b (of FIG. 2A) to create undesirable cross talk, or electrical coupling, between the conductive structures 202a, 202b.

This undesirable cross talk between the conductive structures 202a, 202b may be avoided by applying the insulation process (introduced above) that reduces the conductivity of the conductive extensions 206a, 206b formed by striation, such as by oxidizing or nitriding the conductive extensions 206a, 206b.

Figure 2B:
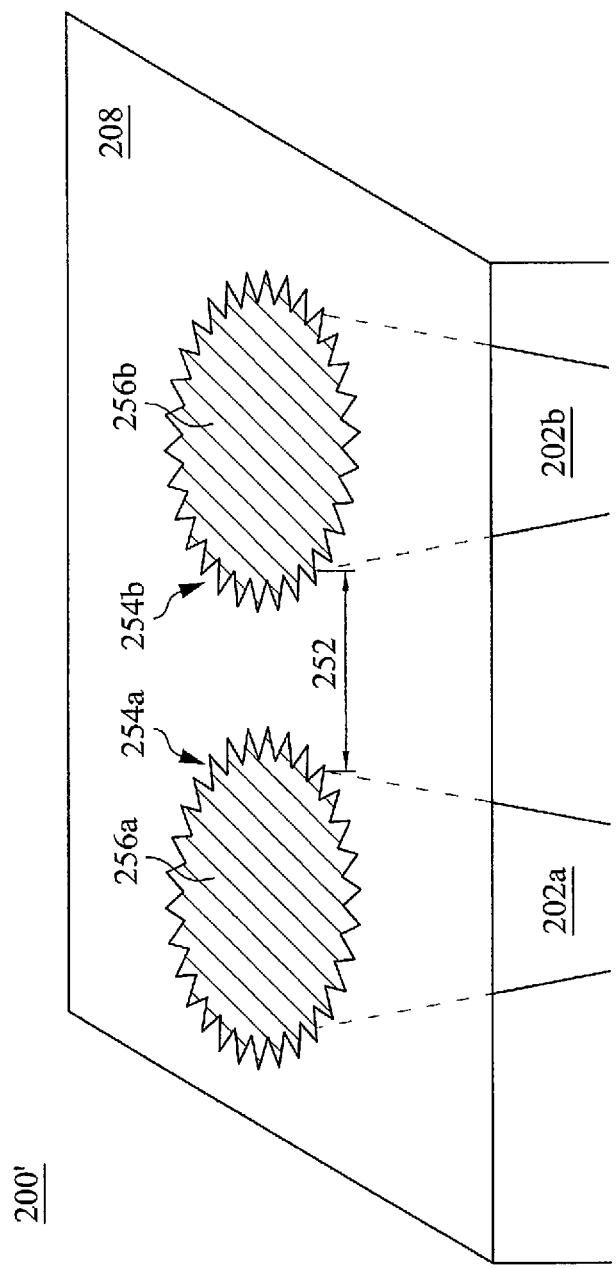
FIG. 2B illustrates conductive structures with striated insulated extensions in accordance with certain embodiments.

FIG. 2B is a three dimensional view of a semiconductor device 200' with striated insulated extensions 254a, 254b after application of the insulation process in accordance with certain embodiments. As introduced above, the insulation process may include applying an insulating medium (e.g., an oxidizing or nitriding gas or plasma) to the surface 208 of the semiconductor device 200 (shown in FIG. 2A) along which the striated conductive extensions 206a, 206b due to striations are exposed. The conductive extensions 206a, 206b (shown in FIG. 2A) are then insulated (e.g., oxidized or nitrated) and transformed into insulated extensions 254a, 254b as illustrated in FIG. 2B. Also, conductive material from the conductive structures 202a, 202b, that are exposed to the insulating medium (e.g., oxidizing or nitriding gas or plasma) may also be oxidized or nitrated and transformed into a non-conductive (or less conductive) material at the exposed portions 256a, 256b of the conductive structures 202a, 202b. Furthermore, by converting the conductive extension to an insulated extension, the non-conductive separation 252 between the conductive structures 202a, 202b may change (or revert) to a separation that is larger than the reduced non-conductive separation of FIG. 2A and be of a magnitude sufficient to effectively reduce or eliminate undesirable crosstalk (or conductive coupling) between conductive structure 202a and conductive structure 202b. In further embodiments, the non-conductive separation 252 between the conductive structures 202a, 202b may change (revert) further back (be even less extended or have even less reach compared to before formation of conductive extensions 206a, 206b of FIG. 2A) when the insulation process is applied as more than the conductive extensions 206a, 206b may become insulated (such as when conductive extensions 206a, 206b and parts of the conductive structures proximate to the conductive extensions, such as exposed portions 204a, 204b, become insulated).

Figure 3:
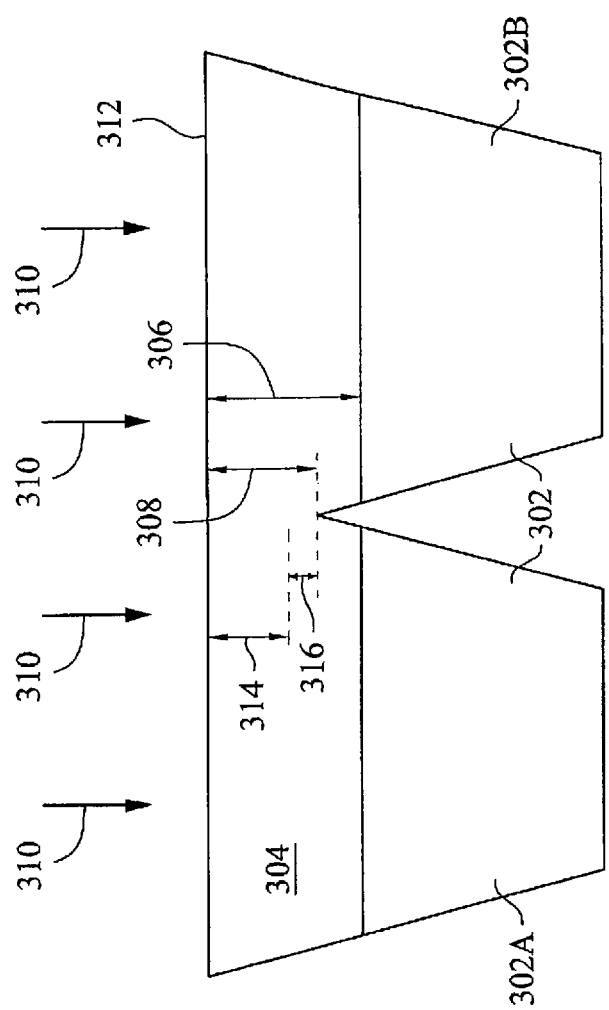
FIG. 3 illustrates a trapezoidal conductive structure with an insulated extension with a depth beyond an effective depth, in accordance with certain embodiments.

FIG. 3 illustrates a trapezoidal conductive structure 302 with an insulated extension 304 with a depth 306 beyond an effective depth 308, in accordance with certain embodiments. As discussed above, the insulating medium 310 (illustrated as downward facing arrows) may transform a portion of the trapezoidal conductive structure 302 (or other type of semiconductor device) from a surface 312 exposed to the insulating medium 310 to at least a particular effective depth 308 into the trapezoidal conductive structure 302. The effective depth 308 may be a minimum depth of insulation at which the individual parts 302A and 302B of the trapezoidal conductive structure 302 may no longer be in undesirable conductive communication. Stated another way, the effective depth 308 may be a minimum depth of insulation to convert undesirable conductive extensions into insulated extensions. For example, insulation of the trapezoidal conductive structure 302 to an insufficient depth 314 would still leave an undesirable conductive depth 316 between the individual parts 302A and 302B of the trapezoidal conductive structure 302. This is because the individual parts 302A and 302B would remain in conductive communication with each other through the undesirable conductive depth 316. However, when the insulated extension has a depth of insulation 306 that is beyond the effective depth 308, the individual parts 302A and 302B of the trapezoidal conductive structure 302 may then no longer be in undesirable conductive communication As discussed above, the insulation process may be tailored to effect a particular effective depth so as to insulate undesirable conductive extensions while not insulating desirable conductive features within the semiconductor device. The insulation process may be tailored by varying features of the insulation process, such as the surface exposed to the insulating medium, the time at which the insulating medium is applied to the semiconductor device, and the potency (e.g., concentration) of the insulating medium.

Figure 4:
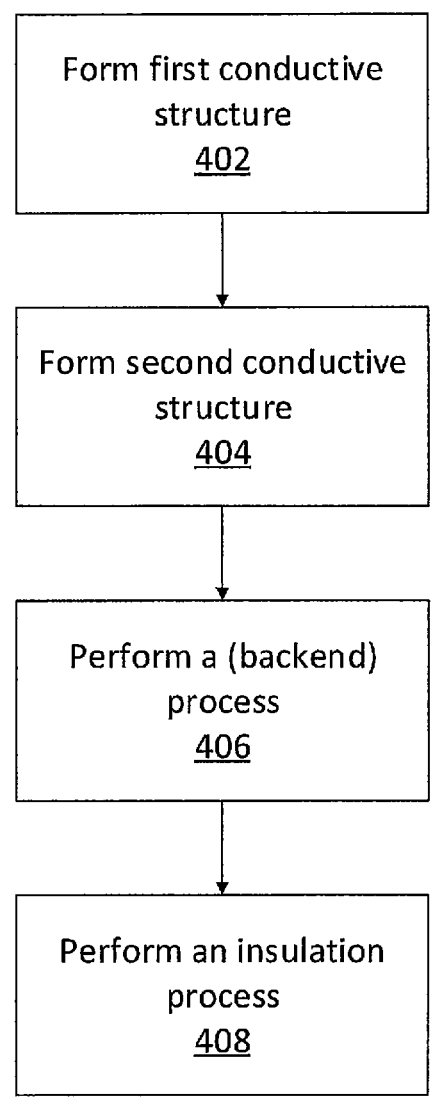
FIG. 4 is a flow chart of a method of insulating extensions in accordance with certain embodiments.

FIG. 4 illustrates a flowchart of a method 400 of insulating extensions in accordance with certain embodiments. It is noted that the method 400 is merely an example, and is not intended to limit the present disclosure. Additional operations can be provided before, during, and after the method 400, and some operations described can be performed concurrently, replaced, eliminated, or rearranged in order, in accordance with additional embodiments.

The method 400 begins with an operation 402 in which a first conductive structure is formed as part of a semiconductor device. The method 400 continues to an operation 404 in which a second conductive structure is formed as part of the semiconductor device. In certain embodiments, operations 402 and 404 may be performed concurrently, such that the first conductive structure and the second conductive structures are formed at the same time. As discussed above, these conductive structures may be exposed at a surface of the semiconductor device and extend through non-conductive material in the semiconductor device to conductively communicate with a conductive feature embedded within the semiconductor device.

Also as introduced above, the conductive structures may be formed as conductive material interconnects of the semiconductor device. In certain embodiments, the conductive material may be aluminum, aluminum alloy, silicon alloy, copper alloy, titanium, titanium nitride, tungsten, polysilicon, metal silicide, copper, copper alloy, tantalum, tantalum nitride, or combinations thereof. These conductive structures may interconnect conductive features within the semiconductor device. In some embodiments, such conductive structures may be formed by a deposition process including a PVD process, a CVD process, a sputtering process, or a combination thereof. Other manufacturing techniques to form the conductive structures may include photolithography processing and etching.

As an illustrative example in reference to the earlier figures, the first conductive structure referred to in operation 402 of FIG. 4 may be vertical conductive structure 104b of FIG. 1A and the second conductive structure referred to in operation 404 of FIG. 4 may be vertical conductive structure 104a of FIG. 1A. As another example, the first conductive structure referred to in operation 402 of FIG. 4 may be conductive structure 202a of FIG. 2A and the second conductive structure referred to in operation 404 of FIG. 4 may be conductive structure 202b of FIG. 2A.

Returning to FIG. 4, the method 400 continues to operation 406 where a backend process is performed with the semiconductor device (e.g., the semiconductor device is processed). The performance of the backend process may include physical manipulation of the semiconductor device, such as lithography, etching, or CMP. As discussed above, this type of processing may dislocate conductive materials from the conductive structure or deposit conductive materials on portions of non-conductive material of the semiconductor device to form a conductive extension. These conductive extensions may be undesirable as they may result in undesirable short circuits or cross talk between conductive structures that were designed to be conductively isolated from each other. In certain embodiments, this processing may modify not only the conductive structures but also the non-conductive materials between the conductive structures (such as by also dislocating or removing some of the non-conductive material).

In certain embodiments, the removed portions of non-conductive material may reduce the non-conductivity of a non-conductive separation and also be a virtual conductive extension (as the removal of non-conductive material may be effectively equivalent to addition of conductive material that extends a conductive reach of a conductive structure).

The insulation process discussed further below can also be applied to virtual conductive extensions formed by removal of material by making the remaining material more resistive or non-conductive by varying features of the insulation process, such as the time at which the insulating medium is applied to (or may remain on) the semiconductor device, and/or the potency (e.g., concentration) of the insulating medium.

As an illustrative example in reference to the earlier figures, the processing referred to in operation 406 of FIG. 4 may form the conductive extension 106 of FIG. 1A. As another example, the processing referred to in operation 406 of FIG. 4 may form the striated conductive extensions 206a, 206b of FIG. 2A.

Returning the FIG. 4, the method 400 continues to operation 408 in which the semiconductor device is subjected to an insulation process that reduces the conductivity of materials exposed to the insulation process. Stated another way, an insulation process is performed with the semiconductor device. As discussed above, the insulation process may include exposing (e.g., bombarding) a surface of the semiconductor device (such as a surface that includes at least one conductive extension) to an insulating medium such as $O_2$ plasma with $Ar^+$ or $N^+$. This exposure may be performed with a patterned mask that exposes a particular surface of the semiconductor device (e.g., a surface with at least one conductive extension) or may be performed without a mask. The surface of the semiconductor device exposed to the insulating medium may become insulated, with lowered conductivity and increased resistivity. Stated another way, exposure of conductive extensions to the insulating medium during the insulation process may transform the conductive extension to an insulated extension composed of high (or higher) resistance (as opposed to conductive) material with a resistance value of $1.6*10^{-6}$ Ω-cm to about $1.6*10^4$ Ω-cm (or greater). The high (or higher) resistance material may include copper oxide, copper nitride, aluminum oxide, aluminum nitride or other suitable materials. Particularly, the copper oxide may include $Cu_xO_y$, x is 1 or 2, and y is 1 or 2.

Also, the insulating medium may transform a portion of the semiconductor device from the surface exposed to the insulating medium to an effective depth. In certain embodiments, this effective depth may be about 30 Å to about 150 Å. Accordingly, portions of conductive extensions that are embedded within the semiconductor material (such as through non-conductive artifacts deposited on the surface of the conductive extension during semiconductor processing) may also be transformed into insulated extensions if within the effective depth (insulation depth) of the insulating medium during the insulation process. Also, the insulation process may be tailored to effect a particular effective depth so as to insulate undesirable conductive extensions while not insulating desirable conductive features within the semiconductor device. The insulation process may be tailored by varying features of the insulation process, such as the surface exposed to the insulating medium, the time at which the insulating medium is applied to the semiconductor device, and the potency (e.g., concentration) of the insulating medium.

As an illustrative example in reference to the earlier figures, performance of the insulation process referred to in operation 408 of FIG. 4 may form the insulated extension 116 of FIG. 1B. As another example, performance of the insulation process referred to in operation 408 of FIG. 4 may form the striated insulated extensions 254a, 254b of FIG. 2B.

This insulation process may be performed after (or in response to) detection or formation of conductive extensions. Alternatively, this insulation process may be performed as an additional precautionary step during semiconductor processing without detecting or forming conductive extensions.

The embodiments of the present disclosure are technically advantageous over existing methods and structures. Yield rates from BEOL processing may be increased by subjecting a semiconductor device to an insulation process that transforms conductive extensions into non-conductive, or insulated, extensions. These insulated extensions may preserve an effective non-conductive separation between conductive structures and avoid the deleterious effects of undesirable cross talk or a short circuit between the conductive structures. It is noteworthy that the physical failure analysis (PFA) results of the semiconductor device without the insulation process (also termed as a post conductive line treatment) during the BEOL processing indicates that yield after BEOL may be greatly reduced if the insulation process (e.g., post conductive line treatment is not applied.

In an embodiment, a semiconductor device includes: a plurality of vertical conductive structures, wherein each of the plurality of vertical conductive structures extends through an isolation layer; and an insulated extension disposed horizontally between a first one and a second one of the plurality of vertical conductive structures.

In another embodiment, a method includes: forming a first conductive structure that extends through an isolation layer over a substrate; forming a second conductive structure that extends through the isolation layer over the substrate; forming an extension between the first conductive structure and the second conductive structure; and exposing the extension to an insulating medium in response to the forming the extension.

In another embodiment, a method for forming a semiconductor device includes: forming a first conductive structure that extends from a surface of the semiconductor device through an isolation layer; forming a second conductive structure that extends from the surface of the semiconductor device through the isolation layer; and exposing a buffer surface of the semiconductor device between the first conductive structure and the second conductive structure to an insulating medium.

The foregoing outlines features of several embodiments so that those ordinary skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

Conditional language such as, among others, "can," "could," "might" or "may," unless specifically stated otherwise, are otherwise understood within the context as used in general to convey that certain embodiments include, while other embodiments do not include, certain features, elements and/or steps. Thus, such conditional language is not generally intended to imply that features, elements and/or steps are in any way required for one or more embodiments or that one or more embodiments necessarily include logic for deciding, with or without user input or prompting, whether these features, elements and/or steps are included or are to be performed in any particular embodiment.

Disjunctive language such as the phrase "at least one of X, Y, or Z," unless specifically stated otherwise, is otherwise understood with the context as used in general to present that an item, terra, etc., may be either X, Y, or Z, or any combination thereof (e.g., X, Y, and/or Z). Thus, such disjunctive language is not generally intended to, and should not, imply that certain embodiments require at least one of X, at least one of Y, or at least one of Z to each be present.

It should be emphasized that many variations and modifications may be made to the above-described embodiments, the elements of which are to be understood as being among other acceptable examples. All such modifications and variations are intended to be included herein within the scope of this disclosure and protected by the following claims.

What is claimed is:

1. A semiconductor device, comprising:
   a plurality of vertical conductive structures, wherein each of the plurality of vertical conductive structures extends through an isolation layer; and
   an insulated extension disposed horizontally between a first vertical conductive structure and a second vertical conductive structure of the plurality of vertical conductive structures, wherein the insulated extension comprises an insulation depth extending into a portion of the first vertical conductive structure and a portion of the isolation layer between the first and second vertical conductive structure, wherein the insulated extension is structurally coupled to the first vertical conductive structure and is separated from the second vertical conductive.

2. The semiconductor device of claim 1, wherein the isolation layer comprises a low dielectric constant material.

3. The semiconductor device of claim 1, wherein each of the plurality of vertical conductive structures is in conductive communication with a respective conductive feature formed in a substrate disposed below the isolation layer.

4. The semiconductor device of claim 1, further comprising a metallization layer comprising a dielectric material and the respective horizontal conductive structure.

5. The semiconductor device of claim 1 further comprising a substrate having the plurality of conductive features formed therein.

6. The semiconductor device of claim 1 further comprising a first intermediate layer disposed between the substrate and the isolation layer.

7. The semiconductor device of claim 6 further comprising:
   first and second intermediate horizontal conductive structures formed in the first intermediate layer, wherein the first and second intermediate horizontal conductive structures are conductively coupled to the first and second vertical conductive structures, respectively.

8. The semiconductor device of claim 7 further comprising:
   a second intermediate layer disposed between the first intermediate layer and the substrate; and
   third and fourth vertical conductive structures formed in the second intermediate layer, wherein the third and fourth vertical conductive structures are conductively coupled to the first and second intermediate horizontal conductive structures.

9. A semiconductor device, comprising:
   a substrate having a plurality of conductive features formed therein;
   an isolation layer disposed above the substrate;

a plurality of vertical conductive structures extending through the isolation layer;

an insulated extension disposed horizontally between a first vertical conductive structure and a second vertical conductive structure of the plurality of vertical conductive structures, wherein the insulated extension comprises an insulation depth extending into a portion of the first vertical conductive structure and a portion of the isolation layer between the first vertical conductive structure and the second vertical conductive structure, wherein the first and second vertical conductive structures are conductively coupled to respective ones of the plurality of conductive features;

a first intermediate layer disposed between the substrate and the isolation layer; and first and second intermediate horizontal conductive structures formed in the first intermediate layer, wherein the first and second intermediate horizontal conductive structures are conductively coupled to the first and second vertical conductive structures, respectively, and wherein the insulated extension is structurally coupled to the first vertical conductive structure and is separated from the second vertical conductive structure.

10. The semiconductor device of claim 9, wherein the isolation layer comprises a low dielectric constant material.

11. The semiconductor device of claim 9, wherein each of the plurality of vertical conductive structures is in conductive communication with a respective one of the plurality of conductive features formed in the substrate.

12. The semiconductor device of claim 9 further comprising a second intermediate layer disposed between the first intermediate layer and the substrate.

13. The semiconductor device of claim 12 further comprising third vertical conductive structures formed in the second intermediate layer, wherein the third vertical conductive structures are conductively coupled to the first intermediate horizontal conductive structures.

14. The semiconductor device of claim 13 further comprising:

fourth vertical conductive structures formed in the second intermediate layer, wherein the fourth vertical conductive structures are conductively coupled to the second intermediate horizontal conductive structures.

15. A semiconductor device, comprising:

a substrate having a plurality of conductive features formed therein;

an isolation layer disposed above the substrate;

a plurality of vertical conductive structures extending through the isolation layer;

an insulated extension disposed horizontally between a first vertical conductive structure and a second vertical conductive structure of the plurality of vertical conductive structures, wherein the insulated extension comprises an insulation depth extending into a portion of the first vertical conductive structure and a portion of the isolation layer between the first vertical conductive structure and the second vertical conductive structure, wherein the first and second vertical conductive structures are conductively coupled to respective ones of the plurality of conductive features;

a first intermediate layer disposed between the substrate and the isolation layer;

first and second intermediate horizontal conductive structures formed in the first intermediate layer, wherein the first and second intermediate horizontal conductive structures are conductively coupled to the first and second vertical conductive structures, respectively;

a second intermediate layer disposed between the first intermediate layer and the substrate; and third and fourth vertical conductive structures formed in the second intermediate layer, wherein the third and fourth vertical conductive structures are conductively coupled to the first and second intermediate horizontal conductive structures, wherein the insulated extension is structurally coupled to the first vertical conductive structure and is separated from the second vertical conductive structure.

\* \* \* \* \*